United States Patent
Khaselev et al.

(10) Patent No.: US 6,726,827 B2
(45) Date of Patent: Apr. 27, 2004

(54) ELECTROPLATING SOLUTION FOR HIGH SPEED PLATING OF TIN-BISMUTH SOLDER

(75) Inventors: Oscar Khaselev, Monmouth Junction, NJ (US); Igor S. Zavarine, Brooklyn, NY (US); Yun Zhang, Warren, NJ (US)

(73) Assignee: Lucent Technologies Inc., Murray Hill, NJ (US)

(*) Notice: Subject to any disclaimer, the term of this patent is extended or adjusted under 35 U.S.C. 154(b) by 0 days.

(21) Appl. No.: 10/050,014

(22) Filed: Jan. 17, 2002

(65) Prior Publication Data

US 2003/0132122 A1 Jul. 17, 2003

(51) Int. Cl.[7] .............. C25D 3/60; C23C 18/00
(52) U.S. Cl. ............. 205/253; 205/252; 106/1.22; 106/1.25
(58) Field of Search ............. 106/1.22, 1.25; 205/252, 253

(56) References Cited

U.S. PATENT DOCUMENTS 5,296,128 A * 3/1994 Gernon et al. ............ 205/254

* cited by examiner

Primary Examiner—Edna Wong

(57) ABSTRACT

In accordance with the present invention, an electroplating solution is provided for electroplating satin bright tin-bismuth alloy solder coatings in high speed electroplating applications. The solution comprises a sulfonic acid electrolyte, a soluble tin compound, a soluble bismuth compound, a non-ionic surfactant, a grain refiner and an antioxidant. The preferred non-ionic surfactant comprises a mixture of polyethylene glycol-block-polypropylene glycol, polyethylene glycol-ran-polypropylene glycol, and ethylenediamine tetrakis (polyethylene glycol-block-polypropylene glycol) tetrol.

9 Claims, 1 Drawing Sheet

ELECTROPLATING SOLUTION FOR HIGH SPEED PLATING OF TIN-BISMUTH SOLDER

FIELD OF THE INVENTION

This invention relates to an aqueous electroplating solution for high speed electroplating satin-bright tin-bismuth solder coatings.

BACKGROUND OF THE INVENTION

Electroplated solder coatings are used extensively in the electronics industry in the manufacture of printed wiring boards (PWBs), electrical contacts and connectors, semiconductor packaging, electrical conduits and other related parts. These plated solder coatings must be pore free, corrosion resistant, and they must display long-term solderability and be free from solderability failures such as non-wetting and dewetting.

Until recently, lead and tin-lead alloys have been the most widely used solder coatings. But because of the toxicity of lead, there has been a world-wide drive to replace lead solders in electronic parts. As a consequence there is an on-going effort to find a replacement for tin-lead solder that can be "dropped" into current applications. Electrodeposited tin-bismuth alloys are possible alternatives to commonly used tin-lead coatings.

Although electroplating of tin-bismuth alloys has been known for many years, it was traditionally considered to be a difficult process, and commercially viable plating baths for these alloys are yet to be developed. The major difficulty in plating tin-bismuth alloys arises from the large difference in standard deposition potential of tin and bismuth ions. This problem was traditionally solved by adding a complexing agent to change the electrodeposition reaction from simple metal ion reduction to reduction of a metal complex. The shift in the reduction potential provided by the complexing agent allows the deposition of two different metals to take place at the same potential over the wide range of current densities. Examples of these complexing agents are polydentate ligands such as EDTA, DTPA, polyamines and gluconates. Complexing usually allows very good control of the plating process and properties of the deposit. However, most of the known complexing agents are environmentally undesirable, and some of them have been banned in many countries.

A different approach to deposition of tin alloys involves utilization of a metal-specific surfactant, which can significantly slow or even inhibit deposition of one of the alloying elements in the certain potential range. The resulting formulation will be environmentally safe, provide good control of alloy composition and have a wide operating window. So far all the attempts to develop such chemistries have failed because of the strong immersion deposition of bismuth on tin parts which always takes place during the electrodeposition process. The phenomenon of immersion deposition is caused by a large difference in the deposition potentials of bismuth and tin when no complexing agent is present. As a result the more noble metal (bismuth) is deposited on the surface of the less noble metal (tin) before, during and after electroplating.

Accordingly there is a need for a new electroplating solution that can produce high speed, satin-bright plating of tin-bismuth alloy that will meet the solderability requirements for PWB and electronics packaging applications. The solution should not contain complexing agents and should avoid bismuth immersion deposition.

SUMMARY OF THE INVENTION

In accordance with the present invention, an electroplating solution is provided for electroplating satin bright tin-bismuth alloy solder coatings in high speed electroplating applications. The solution comprises a sulfonic acid electrolyte, a soluble tin compound, a soluble bismuth compound, a non-ionic surfactant, a grain refiner and an antioxidant. The preferred non-ionic surfactant comprises a mixture of polyethylene glycol-block-polypropylene glycol, polyethylene glycol-ran-polypropylene glycol, and ethylenediamine tetrakis (polyethylene glycol-block-polypropylene glycol) tetrol.

BRIEF DESCRIPTION OF THE DRAWINGS

The advantages, nature and various additional features of the invention will appear more fully upon consideration of the illustrative embodiments now to be described in detail in connection with the accompanying drawing. In the drawing.

DETAILED DESCRIPTION

Figure 1:
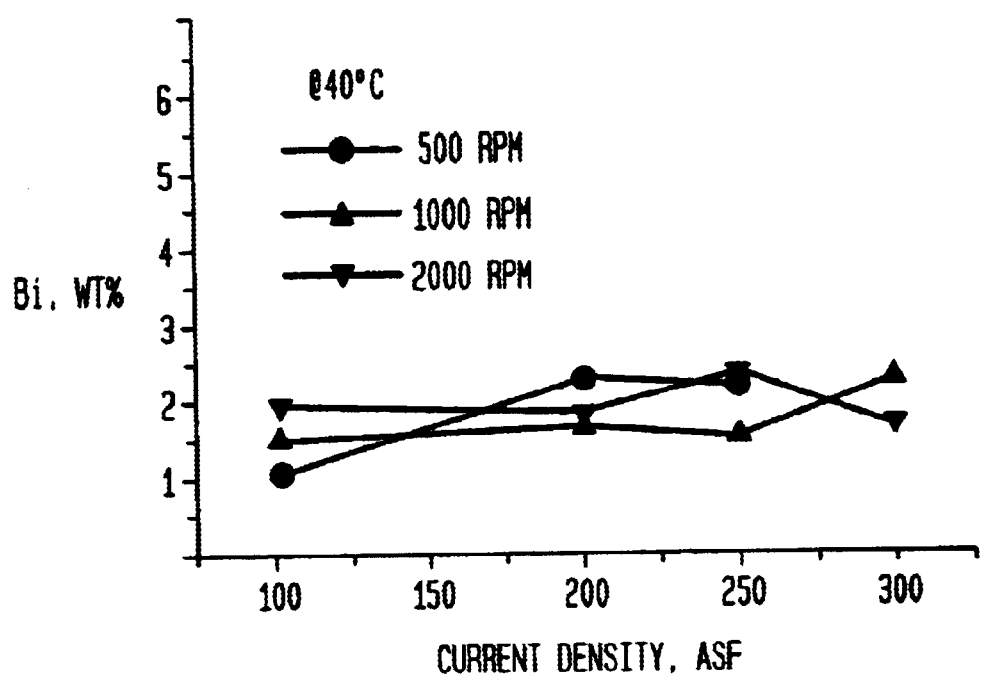
FIG. 1 is a graphical illustration showing the bismuth content in the alloy as a function of applied current density and rotation speed of a cylindrical plating electrode.

In order to become a drop-in replacement for tin-lead solder in PWB and semiconductor applications, tin-bismuth alloys should provide good solderability. In order to provide good solderability, bismuth content in the alloy should normally be between 0.5 and 5%. Therefore matte or satin bright solder finishes are usually utilized when solderability is crucial because bright alloys typically have high carbon content that leads to soldering problems. Satin bright finishes provide distinct advantages when compared to matte finishes such as smoother surface, more cosmetic (visual) appeal and better solderability.

Applicants have formulated electroplating solutions that produce satin bright tin-bismuth alloy solder coatings having low organic (carbon) content at current densities as high as 300 ASF. A preferred electroplating solution comprises methanesulfonic acid, tin sulfonate methanesulfonate, bismuth methanesulfonate, non-ionic surfactant, grain refiner and an antioxidant. The coatings have excellent reflowability and solderability.

To improve the dispersibility of the solution, non-ionic surfactants are added to the solution. The non-ionic surfactants improve the dispersibility and also insure that the plated solder coatings adhere well to the underlying substrate. The preferred surfactant comprises one or more (and preferably a mixture of) the following 1) polyethylene glycol-block-polypropylene glycol with a molecular weight between 2,000 and 10,000, 2) polyethylene glycol-ran-polypropylene glycol with a molecular weight between 2,000 and 10,000, and 3) ethylenediamine tetrakis polyethylene glycol-block-polypropylene glycol tetrol with a molecular weight between 2,000 and 7,000.

The preferred antioxidant is a polyhydroxybenzine.

The preferred grain refiner comprises an acrylic acid.

The sulfonic acid electrolyte used in the solution should be water soluble or soluble in the solution. The preferred sulfonic acid comprises methanesulfonic acid. Alternative sulfonic acids include the lower alkane or alkanol sulfonic acids containing 1–5 carbon atoms.

The tin and bismuth compounds typically used in the solution are those which are soluble in the sulfonic acid and form a sulfonic acid salt. Tin, for example, can be added as tin methane sulfonate, and bismuth can be added as bismuth methanesulfonate. Alternatively the metals can be added in other forms so long as sufficient sulfonate ions are present that the metals predominate as sulfonates in the bath.

A solution for electroplating a tin-bismuth alloy is typically prepared by adding about 150 g/l of the tin methanesulfonate and 12 g/l of bismuth methanesulfonate, 10 g/l of the mixture of above mentioned surfactants and 1 g/l methacrylic acid and 2 g/l of catechol.

After the solution is prepared, it can then be used in a high speed electroplating process for electroplating tin-bismuth alloy onto a metal substrate by placing the metal substrate in the solution equipped with a conventional plating electrode. The electroplating solution is maintained at a temperature in the range 18–45° C. The current densities used for the electroplating are typically between 100 and 300 ASF.

The substrate is maintained in the solution under the above conditions for a period of time sufficient to plate the substrate with a tin-bismuth alloy coating of a desired thickness, typically in the range 3–6 micrometers.

The alloy composition was stable in a wide operating window and was only slightly sensitive to the agitation and the current densities, see FIG. 1. The excellent solderability of the tin-bismuth deposit was demonstrated in numerous experiments, such as "dip-and-look" solderability tests and reflow. The major advantage of the proposed bath is the negligible immersion of bismuth on tin electrodes, which are typically left in solution for prolonged time.

It is understood that the above-described embodiments are illustrative of only a few of the many possible specific embodiments, which can represent applications of the invention. Numerous and varied other arrangements can be made by those skilled in the art without departing from the spirit and scope of the invention.

What is claimed is:

1. An electroplating solution for plating tin-bismuth solder coatings comprising:

a sulfonic acid electrolyte;

a tin compound soluble in the electrolyte to form a tin sulfonate;

a bismuth compound soluble in the electrolyte to form a bismuth sulfonate;

a non-ionic surfactant comprising:
(a) a polyethylene glycol-block-polypropylene glycol with a molecular weight between 2,000 and 10,000, and
(b) a polyethylene glycol-ran-polypropylene glycol with a molecular weight between 2,000 and 10,000;

a grain refiner; and an antioxidant.

2. The electroplating solution of claim 1 wherein the non-ionic surfactant comprises ethylenediamine tetrakis polyethylene glycol-block-polypropylene glycol tetrol with a molecular weight between 2,000 and 7,000.

3. The electroplating solution of claim 1 wherein the antioxidant comprises polyhydroxybenzene.

4. The electroplating solution of claim 1 wherein the grain refiner comprises an acrylic acid.

5. The electroplating solution of claim 1 wherein the tin compound comprises a tin sulfonate.

6. The electroplating solution of claim 1 wherein the bismuth compound comprises a bismuth sulfonate.

7. The electroplating solution of claim 1 wherein the tin compound comprises a tin sulfonate and the bismuth compound comprises a bismuth sulfonate.

8. The electroplating solution of claim 1 wherein the sulfonic acid electrolyte comprises a soluble alkane or alkanol sulfonic acid containing 1–5 carbon atoms.

9. The electroplating solution of claim 1 wherein the sulfonic acid comprises methanesulfonic acid.

* * * * *